United States Patent

Ko et al.

[11] Patent Number: 5,360,766
[45] Date of Patent: Nov. 1, 1994

[54] METHOD FOR GROWING A HIGH-MELTING-POINT METAL FILM

[75] Inventors: Kwang-Ok Ko, Seoul; Jong-Ho Park, Goyang, both of Rep. of Korea

[73] Assignee: SamSung Electronics Co., Ltd., Suwon, Rep. of Korea

[21] Appl. No.: 5,068

[22] Filed: Jan. 15, 1993

Related U.S. Application Data

[63] Continuation of Ser. No. 575,627, Aug. 31, 1990, Pat. No. 5,180,468.

[30] Foreign Application Priority Data

Jun. 5, 1990 [KR] Rep. of Korea ............... 10173/1990

[51] Int. Cl.⁵ .............................................. H01L 21/44
[52] U.S. Cl. .................................. 437/192; 437/187; 437/190; 437/977
[58] Field of Search ................ 437/192, 187, 190, 977

[56] References Cited

U.S. PATENT DOCUMENTS

| | | | |
|---|---|---|---|
| 4,575,920 | 3/1986 | Tsunashima | 437/192 |
| 4,902,645 | 2/1990 | Ohba | 437/192 |
| 5,094,965 | 3/1992 | Ozaki et al. | 437/192 |
| 5,180,468 | 1/1993 | Ko et al. | 156/644 |
| 5,223,455 | 6/1993 | Itoh et al. | 437/192 |

FOREIGN PATENT DOCUMENTS

| | | | |
|---|---|---|---|
| 0015917 | 1/1989 | Japan | |
| 0082620 | 3/1989 | Japan | 437/192 |
| 0129969 | 5/1989 | Japan | |
| 0058218 | 2/1990 | Japan | |
| 0203523 | 8/1990 | Japan | |

*Primary Examiner*—Tom Thomas
*Assistant Examiner*—Trung Dang
*Attorney, Agent, or Firm*—Robert E. Bushnell

[57] ABSTRACT

There is disclosed a process for growing a high-melting-point metal film steps of forming a first ion-implanted layer in a given region of a silicon substrate, in which region a second ion-implanted layer is formed; contacting a high-melting-point metal fluoride gas with the surface of the second ion-implanted layer to adhere the high-melting-point metal thereto; growing the high-melting-point metal film of a given thickness by reacting the mixture of the high-melting-point metal fluoride and silane gas; and subjecting the silicon substrate to a heat treatment, characterized in that the above third and fourth steps are alternatively repeated.

24 Claims, 3 Drawing Sheets

METHOD FOR GROWING A HIGH-MELTING-POINT METAL FILM

The present invention is a continuation of a patent application filed in the United States Patent & Trademark Office on Aug. 31, 1990, assigned Ser. No. 07/575,627 and issued as U.S. Pat. No. 5,180,468 on Jan. 19, 1993.

BACKGROUND OF THE INVENTION

The present invention concerns a process for producing semiconductor devices, particularly a process for growing a tungsten film of a high-melting-point during a metallization process.

In metallization for semiconductor devices, a chemical vapor deposition (CVD) technique is attractive for making a uniform layer of good step coverage. Unlike the vacuum deposition, which suffers from a shadow effect and imperfect step coverage, the CVD technique can yield good step coverage even with great irregularity of the surface condition of the semiconductor devices, and also yields lower electrical resistivity.

One of the efforts of depositing metal for semiconductor devices by the CVD technique has been in deposition of a metal of high refractory characteristics such as tungsten, W (chemical symbol W). Tungsten also has a low resistivity (5.3 $\mu\Omega$-cm), and may be grown from tungsten fluoride ($WF_6$) by both pyrolytic and reduction reaction.

Referring to FIG. 1 for illustrating the result of a conventional process for selectively growing tungsten W, in a given region of a silicon layer 1 is formed a junction layer 2 by ion implantation, over which the junction layer 2 is covered by an insulating layer 3 which is selectively etched to form a pattern, through which tungsten 4 is grown by the CVD technique. In this case, in order to improve the adherence between the tungsten and the junction layer 2 in the initial growing step, plasma etching is performed on the surface of the layer by using $NF_3$, $SF_6$ gases, etc., thus roughening the surface, or silane ($SiH_4$) reduction is performed after hydrogen ($H_2$) reduction is performed so as to grow the tungsten thereon. However, the plasma etching results in a considerable corrosion in a contacting region 5 between the layer 2 and the tungsten, so that a large amount of the silicon in the contacting layer 2 is eroded causing the thickness of the contacting layer 2 to thin, thus increasing current leakage. Alternatively, if the tungsten is grown by $SiH_4$ reduction, bad adherence occurs, which causes removal of the tungsten.

SUMMARY OF THE INVENTION

It is therefore an object of the present invention to provide a process for growing tungsten, with a use of a CVD technique, which improves the adherence between the tungsten and the junction layer without damaging the junction layer.

It is another object of the present invention to prevent current leakage in metallization of semiconductor devices.

According to an aspect of the present invention, the inventive process is characterized in that, after ion implantation of a region to be contacted with the tungsten, the pyrolysis of the mixture of $WF_6$ and $SiH_4$ gases and annealing are alternatively repeated to grow a tungsten film of a given thickness.

The present invention will now be described with reference to the drawings attached only by way of example.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF A CERTAIN PREFERRED EMBODIMENT

Figure 1:
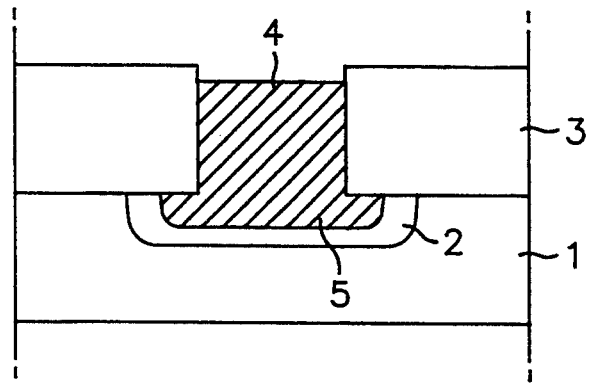
FIG. 1 is a schematic cross-section of a semiconductor device according to the conventional process.
Figure 2:
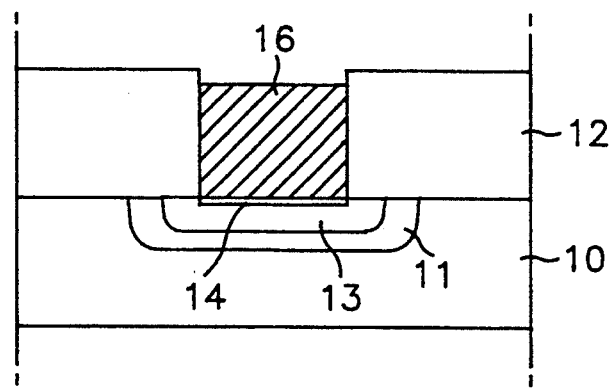
FIG. 2 is a view similar to FIG. 1 according to the inventive process.

Referring to FIG. 2, in silicon substrate 10 are formed first and second ion-implanted layers 11 and 13. Between the second ion-implanted layer 13 and tungsten film 16 grown according to the pattern of insulating layer 12, there is interposed thin contacting layer 14, which has an irregular surface damaged by ion implantation to adhere the tungsten film 16 to the silicon substrate 10. The degree of the surface damage by ion implantation is negligible compared with the case by conventional plasma etching, while improving the adherence of the surface of the junction layer. The contacting layer 14 is formed by annealing after the reaction between $SiH_4$ and $WF_6$.

Figure 3A:
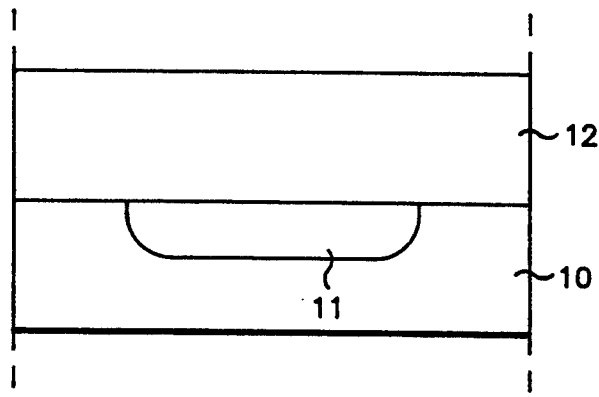
FIGS. 3A–3E illustrate the steps of the inventive process.

Referring to FIGS. 3A–3E, the inventive process for growing the tungsten film will now be described. In FIG. 3A, P type or N type impurity is ion-implanted into the silicon substrate 10 with the amount of $5 \times 10^{20}$ ions/$cm^2$, over which an insulating layer 12 of BPSG (Boro-Phosphorus Silicate Glass) is covered. In this case, the ion-implanted P or N type impurity is activated so as to form the first ion-implanted region 11 (or, first collecting region).

Figure 3B:
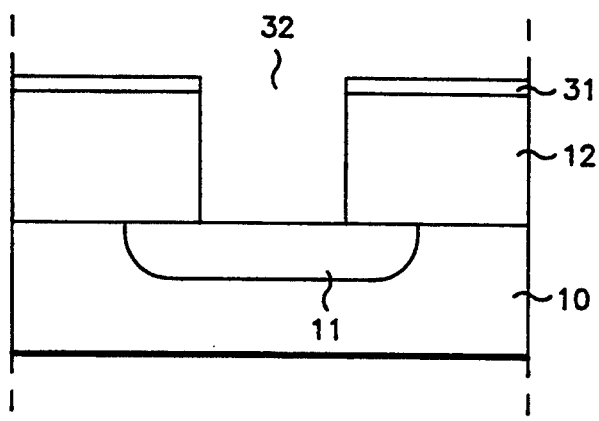

Referring to FIG. 3B, over the insulating layer is formed a photoresist pattern 31 to selectively etch the insulating layer 12, so that contacting aperture 32 is formed to expose the surface of the the first ion-implanted layer 11.

Figure 3C:
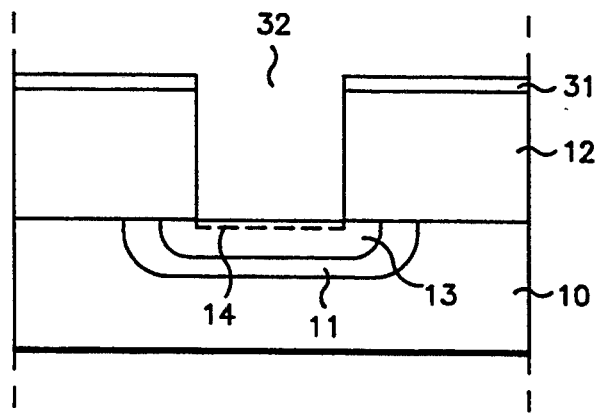

Referring to FIG. 3C, in the bottom surface of the contacting aperture 32 exists imperfection layer 14 having the thickness of about 200–500 Å which is formed by double-performed ion implantation. The ion-implanted substance may be Si, As, B, P, etc. The imperfection layer 14 has a rough surface to increase the adherence between the substrate and the tungsten during the tungsten forming process.

Figure 3D:
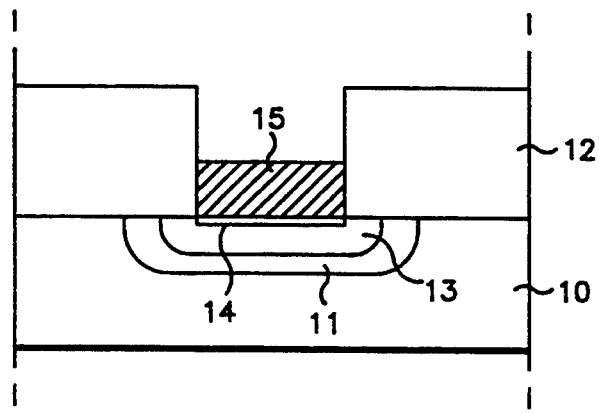

Referring to FIG. 3D, after removing the photoresist pattern 31, tungsten fluoride ($WF_6$) is reacted with the silicon substrate 10 so as to cause silicon reduction to grow tungsten on the surface of the imperfection layer 14 with a small consumption of silicon. The above silicon reduction formular can be expressed as follows:

$$WF_6 + 3Si \rightarrow 2W + 6SiF_4 \tag{1}$$

Herein, the adherence of the tungsten and the silicon substrate 10 is increased due to the high surface energy of the imperfection layer 14. Thereafter, with the mixture of tungsten fluoride $WF_6$ and silane $SiH_4$ gases having the ratio of about 3 to 2, the CVD process is performed at the temperature of 280°–300° C. for 45–90 seconds so as to grow initial tungsten film 15 having the thickness of about 1,500–3,000 Å. In this case, the reaction formula is as follows:

$$WF_6 + 3/2\ SiH_4 \rightarrow W + 3/2\ SiF_4 + 3H_2 \quad (2)$$

If the the ratio of silane ($SiH_4$) gas to tungsten fluoride ($WF_6$) is 2 to 1 or 3 to 1, there will be formed tungsten silicide. Hence, it is to be noticed that the ratio of silane $SiH_4$ to tungsten fluoride should be relatively small so as to only grow tungsten W.

Figure 3E:
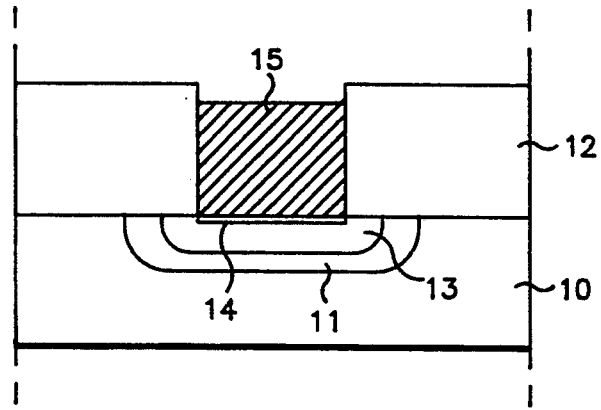

Subsequently, the silicon substrate 10 is annealed at the temperature of about 450° C. for about 2 minutes, which is again subjected to tungsten growing by using the mixture of $WF_6$ and $SiH_4$. In this way, the tungsten growing and annealing are alternatively repeated until the tungsten film 16 of a given thickness is obtained as shown in FIG. 3E.

Herein, it will be appreciated by a person skilled in this technical field that the thickness of the tungsten film obtained by a single growing step by the mixture of $WF_6$ and $SiH_4$ gases is determined according to the desired growing adequacy of the tungsten layer.

As described above, according to the present invention, in the surface of the silicon substrate is formed a thin imperfection layer by performing ion implantation twice, which imperfection layer is caused to have an increased adherence to tungsten through silicon reduction. Thereafter, $SiH_4$ reduction and annealing are alternatively repeated to grow tungsten, so that a uniform tungsten film of good adherence is obtained.

Further, the present invention ensures good step coverage and prevents current leakage due to uniform high-melting-point metal growth.

While the invention has been particularly shown and described with reference to a preferred embodiment, it will be understood by those skilled in the art that modifications in detail may be made without departing from the spirit and scope of the invention.

What is claimed:

1. A method for growing a high-melting-point metal film on a substrate, comprising the steps of:
   forming a first ion-implanted layer in a given region of said substrate, and forming in said first ion-implanted layer a second ion-implanted layer;
   contacting a surface of said second ion-implanted layer with a high-melting point metal fluoride gas to thereby form a film of high-melting-point metal onto the surface of said second ion-implanted layer;
   growing said film of high-melting-point metal to a given thickness by reacting said high-melting-point metal fluoride gas with silane gas; and
   subjecting said substrate to a heat treatment.

2. The method as claimed in claim 1, wherein said first and second ion-implanted layers are dopants formed by impurities selected from the group comprised of silicon, arsenic, boron, or phosphorous.

3. The method as claimed in claim 1, further comprised of forming an imperfect layer of about 200–500 Å on a surface of said second ion-implanted layer during said step for forming said second ion-implanted layer in said first ion-implanted layer.

4. The method as claimed in claim 1, wherein said high-melting-point metal fluoride gas and said silane gas is mixed with a mixing ratio of about three to two, and said step of growing said film of high-melting-point metal further comprises the step of:
   reacting said high-melting-point metal fluoride gas with said silane gas for 45 to 90 seconds at a temperature between 280° C. and 300° C. to grow said film of high-melting-point metal to an initial thickness of about 1,500–3,000 Å; and
   subjecting said silicon substrate to the heat treatment for 2 minutes at the temperature of about 450° C.;
   repeating, alternately, the step of reacting said high-melting-point metal fluoride gas with said silane gas, and the step of subjecting said silicon substrate to the heat treatment, until said film of high-metal-point metal is grown to said given thickness.

5. The method as claimed in claim 1, wherein said step for subjecting said silicon substrate to a heat treatment is continued for about 2 minutes at a temperature of about 450° C.

6. A method for growing a high-melting-point metal film on a substrate, comprising the steps of:
   forming a first ion-implanted layer in a given region of said substrate, over which an insulating layer is deposited;
   selectively etching said insulating layer to form a contacting aperture through which a portion of said first ion-implanted layer is exposed;
   forming on a surface of said first ion-implanted layer, a second ion-implanted layer having surface imperfection by ion-implantation of a given impurity through said contacting aperture;
   growing a film of a high-melting-point metal on the surface of said second ion-implanted layer by exposing the surface of said second ion-implantation to a high-melting-point metal fluoride gas through said contacting aperture; and
   pyrolyzing a mixture of said high-melting-point metal fluoride gas and a silane gas, having a mixing ratio of three to two, respectively, through said contacting aperture for 45–90 seconds at a temperature between 280° C. and 300° C., to grow said film of high-melting-point metal on the surface of said second ion-implanted layer to a selected thickness; and
   subjecting said substrate to a heat treatment for two minutes at the temperature of about 450° C.

7. The method as claimed in claim 6, wherein said given impurity of the ion implantation is of silicon, arsenic, boron, or phosphorous.

8. The method as claimed in claim 6, comprised of forming an imperfect layer of about 200–500 Å on a surface of said second ion-implanted layer in said step of forming said second ion-implanted layer on said surface of said first ion-implanted layer.

9. The method as claimed in claim 6, wherein said high-melting-point metal fluoride gas is tungsten fluoride, and said film of high-melting-point metal is tungsten.

10. The method as claimed in claim 6, further comprised of alternately repeating said step of pyrolyzing the mixture of said high-melting-point metal fluoride gas and said silane gas and said step of subjecting said silicon substrate to a heat treatment until said film of high-melting-point metal is grown to said selected thickness.

11. The method as claimed in claim 1, wherein said step of growing said film of high-melting-point metal comprises the step of:
   reacting said high-melting-point metal fluoride gas with said silane gas for a first time period at a first temperature to grow said film of high-melting-point metal to a first thickness; and subjecting said silicon substrate to the heat treatment for a second time period at a second temperature;

repeating the step of reacting said high-melting-point metal fluoride gas with said silane gas, and the step of subjecting said silicon substrate to the heat treatment, successively to increase the thickness of said film of high-melting-point metal until said film of high-metal-point metal is grown to said given thickness.

12. The method as claimed in claim 11, wherein said first time period is about 45–90 seconds, said first temperature is between 280° C. and 300° C., said second time period is about minutes and said second temperature is about 450° C.

13. A method for growing a high-melting-point metal film on a substrate, comprising the steps of:

forming a contact hole by etching a portion of an insulation layer formed on said substrate;

forming first and second ion-implanted regions within the contact hole, beneath the surface of said substrate by successively implanting impurities of a conductivity type into the surface of said substrate exposed by said contact hole, said second ion-implanted region being formed within said first ion-implanted region and positioned directly beneath the surface of said substrate exposed by said contact hold;

contacting the surface of said second ion-implanted region with a high-melting-point metal fluoride gas to form a high-melting-point metal film on the surface of said second ion-implanted region, within said contact hole; and growing said high-melting-point metal film, within said contact hole, to a selected thickness by depositing said high-melting-point metal fluoride gas and silane gas, and annealing said substrate.

14. The method as claimed in claim 13, wherein said high-melting-point metal fluoride gas is tungsten fluoride, and said high-melting-point metal film is tungsten.

15. The method as claimed in claim 13, further comprised of forming an imperfection layer of about 200–500 Å on the surface of said second ion-implanted region, within said contact holed, after said second ion-implanted region is formed within said first ion-implanted region.

16. The method as claimed in claim 13, further comprised of repeating the chemical deposition of said high-melting-point metal fluoride gas and said silane gas, and the annealing of said substrate until said high-melting-point metal film is grown to said selected thickness.

17. The method as claimed in claim 13, wherein said step of growing said high-melting-point metal film comprises the step of:

depositing said high-melting-point metal fluoride gas and said silane gas for a first time period at a first temperature to grow said high-melting-point metal film to an initial thickness; and annealing said substrate for a second time period at a second temperature;

repeating the step of depositing said high-melting-point metal fluoride gas and said silane gas, and the step of annealing said substrate, successively to increase the thickness of said high-melting-point metal film until said high-metal-point metal film is grown to said selected thickness.

18. The method as claimed in claim 17, wherein said first time period is about 45–90 seconds, said first temperature is between 280° C. and 300° C., said second time period is about 2 minutes and said second temperature is about 450° C.

19. The method as claimed in claim 13, wherein said impurities are selected from the group comprised of silicon, arsenic, boron, or phosphorous.

20. A semiconductor device having a high-melting-point metal film formed on a surface of at least one contact hole formed on a substrate, said semiconductor device being prepared by a process comprising the steps of:

forming first and second ion-implanted regions within the contact hole, beneath the surface of said substrate by successively implanting impurities of a conductivity type into the surface of said substrate exposed by said contact hole, said second ion-implanted region being formed within said first ion-implanted region and positioned directly beneath the surface of said substrate exposed by said contact hold;

contacting the surface of said second ion-implanted region with a high-melting-point metal fluoride gas to form a high-melting-point metal film on the surface of said second ion-implanted region, within said contact hole;

depositing said high-melting-point metal fluoride gas and silane gas to grow said high-melting-point metal film, within said contact hole, to a selected thickness;

annealing said substrate; and repeating the step of depositing said high-melting-point metal fluoride gas and said silane gas, and the step of annealing said substrate, successively to increase the thickness of said high-melting point metal film until said high-metal-point metal film is grown to said selected thickness.

21. The semiconductor device as claimed in claim 20, wherein said high-melting-point metal fluoride gas is tungsten fluoride, and said high-melting-point metal film is tungsten.

22. The semiconductor device as claimed in claim 20, said process further comprised of forming an imperfection layer of about 200–500 Å on the surface of said second ion-implanted region, within said contact hole, after said second ion-implanted region is formed within said first ion-implanted region.

23. The semiconductor device as claimed in claim 20, wherein said high-metal-point metal film is grown to said selected thickness by initially depositing said high-melting-point metal fluoride gas and said silane gas for 45–90 seconds at a temperature between 280° C and 300° C. to grow said high-melting-point metal film to an initial thickness of about 1,500–3,000 Å, and annealing said substrate for about 2 minutes at a temperature of about 450° C., and repeating, alternatively, the step of depositing said high-melting-point metal fluoride gas and said silane gas, and the step of annealing said substrate, until said high-metal-point metal film is grown to said selected thickness.

24. The semiconductor device as claimed in claim 20, wherein said impurities are selected from the group comprised of silicon, arsenic, boron, or phosphorous.

* * * * *